United States Statutory Invention Registration [19]

[11] Reg. Number: H354

Rubin [43] Published: Oct. 6, 1987

[54] LINEAR ALGORITHM FOR NON-LINEAR INTERPOLATION FOR COMPUTER AIDED DESIGNS

[75] Inventor: Stuart H. Rubin, Bethlehem, Pa.

[73] Assignee: The United States of America as represented by the Secretary of the Army, Washington, D.C.

[21] Appl. No.: 848,416

[22] Filed: Apr. 4, 1986

[51] Int. Cl.[4] ..... G06F 15/606

[52] U.S. Cl. ..... 364/491

*Primary Examiner*—Stephen C. Buczinski
*Assistant Examiner*—Linda J. Wallace
*Attorney, Agent, or Firm*—Anthony T. Lane; Sheldon Kanars; John K. Mullarney

[57] ABSTRACT

The linear algorithm described differs from other artificial intelligence programs in its operation over a continuous representation. In the algorithm, the size of the exponent is tied to the magnitude of the learning base employed, and the design thus becomes more selective as the learning base grows. With it, "run time" and "chip size" can be analyzed in substantially linear time.

1 Claim, 1 Drawing Figure

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

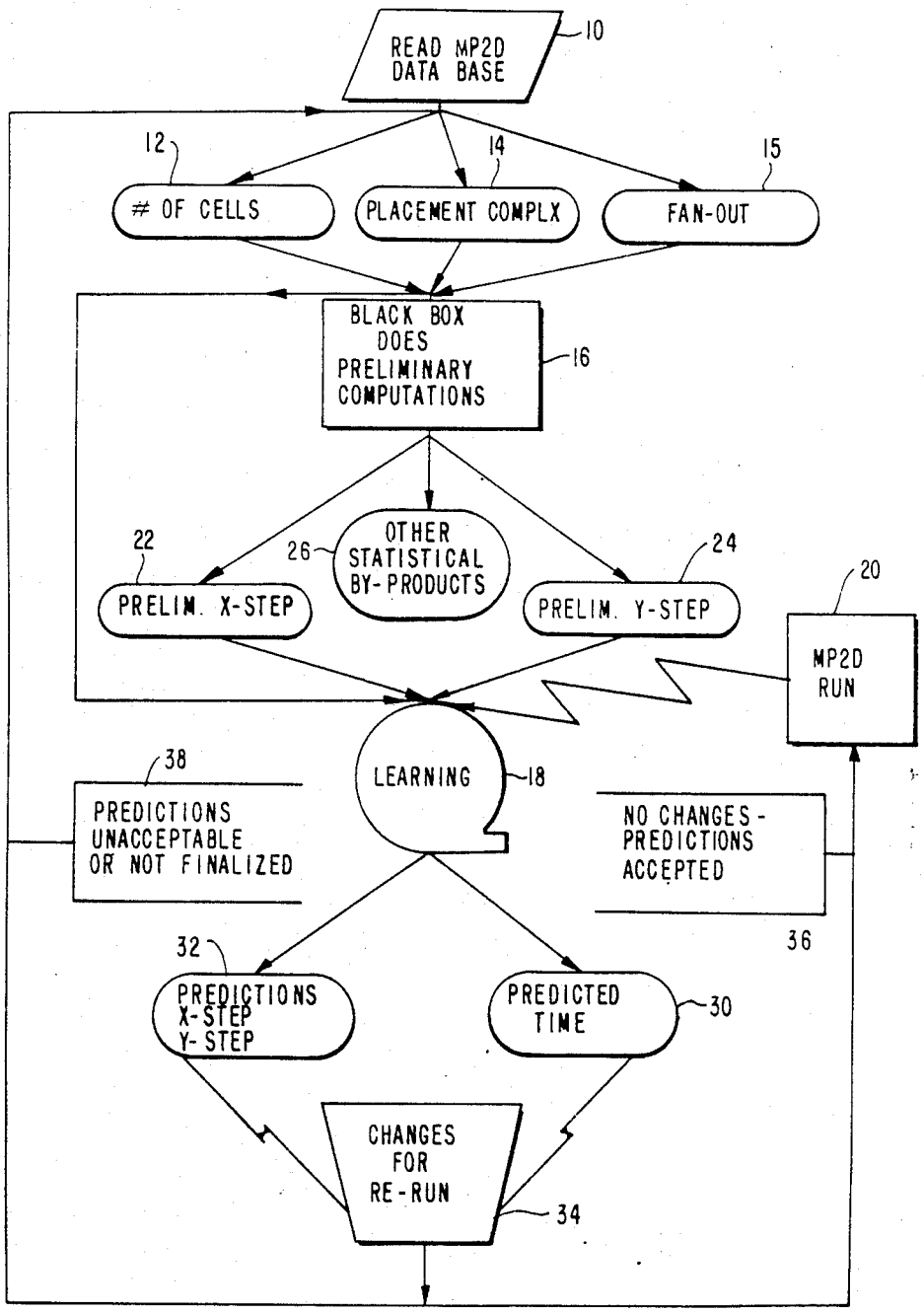
READ MP2D DATA BASE
10
12
14
15
OF CELLS
PLACEMENT COMPLX
FAN-OUT
BLACK BOX DOES PRELIMINARY COMPUTATIONS
16
22
26
24
20
OTHER STATISTICAL BY-PRODUCTS
PRELIM. X-STEP
PRELIM. Y-STEP
MP2D RUN
38
LEARNING
18
PREDICTIONS UNACCEPTABLE OR NOT FINALIZED
NO CHANGES - PREDICTIONS ACCEPTED
36
32
PREDICTIONS X-STEP Y-STEP
PREDICTED TIME
30
CHANGES FOR RE-RUN
34

LINEAR ALGORITHM FOR NON-LINEAR INTERPOLATION FOR COMPUTER AIDED DESIGNS

The invention described herein may be manufactured, used, and licensed by or for the Government for Governmental purposes without the payment of any royalties thereon.

FIELD OF THE INVENTION

This invention relates to computer aided intelligence design and, more particularly, to an artificial intelligence program for use wherever very fast, interpolating learning algorithms are required.

BACKGROUND OF THE INVENTION

As is well known and understood, artificial intelligence programs are often employed in computer aided design to predict "run time" and "chip size" when dealing in chip development and performance.

As is also well known, one of the mostly used computers for this design is the RCA-MP2D. As will additionally be appreciated by those skilled in the art, improvements are always desired to enhance performance and offer other advantages in design analysis so as to advance the state of the artificial intelligence design.

SUMMARY OF THE INVENTION

As will be seen hereinafter, the linear algorithm of the present invention is a deterministic algorithm, which permits a user to store any MP2D run, and retrieve any of the "run's" statistics, inclusive of "run time". When written in Fortran, it is such a "learning base" which permits a user to predict such statistics in 0 (N) time—i.e., linear time, along with a measurement of reliability, and for any or all of the maximum 961 runs permitted with the MP2D computer. Although, in a preferred embodiment of the invention, a cell counter interface to the MP2D input was employed of a 0 (N**2) process, in operation this would still be considered as a 0 (N) process with but little loss in performance if some 3,000 cells were exceeded—and, for the reason that any standby on a computer just to count cells does not establish any substantial problem as it takes many orders of magnitude more time to establish the existing MP2D input form (and, since the cell count is only performed once, never for the "re-run" modifications). As will be seen from the description that follows, the linear algorithm of the invention will be seen to operate utilizing three of the basic statistics from the MP2D input base—namely, (a) the number of cells; (b) the number of basic wires required; and (c) the estimated placement complexity.

BRIEF DESCRIPTION OF THE DRAWING

These and other features of the present invention will be more clearly understood from a consideration of the following description, taken in connection with the accompanying drawing which shows a flowchart helpful in an understanding of the manner by which the linear algorithm operates.

DETAILED DESCRIPTION OF THE DRAWING

Referring to the drawing, the MP2D data base is indicated at 10, and is read to provide the statistics as the number of cells 12, the estimated placement complexity 14 and the fan-out 15 (i.e. the number of basic wires required). In accordance with the present invention, the number of basic wires (at 15) represents a sum of the fan-out for each cell, while the estimated placement complexity represents the sum of the squares for each fan-out. To present any "double counting", the algorithm of the invention envisions the "squaring" only of these outputs. As a result, a rudimentary basis is established for forming a quadratic polynomial, X**2+X+K; where K represents the number of cells. The placement, on the other hand (about 80% of the time), is bounded above as being a quadratic assignment problem—hence the utilization of the "square" term for processing. Following from the MP2D use of partitioning, such placement indeed constitutes an upper bound, where, in addition, the MP2D allows for a small, fixed allocation. Even though all the remaining time is incurred in routing, a linear polynomial is not sufficient as it does not account for the quadratic nature of the problem—therefore, the use of the "square term" is required.

In carrying out the performance predictions with the invention, the square root of the number of cells is employed as one estimate of the chip size. Such determination follows because the chips employed are two-dimensional, and because the mathematically optimal chip is of a "square" configuration.

According to the invention, it is also determined that a critical path should be included to increase the relative MP2D time—which longer time is predicted by a linear increase in the number of basic wires required. With that definition, and supposing that the MP2D computer always did an optimal placement, then it would follow that the inclusion of the critical path could only increase the chip size, as such constraint would enjoin doing better than the minimum otherwise selected. In fact, however, the empirical data obtained evidenced that the MP2D does not always provide for the optimal cell placement—and, for the reason, that the inclusion of the critical path occasionally decreased the resultant chip size as a contradiction. In the discussion that follows, the described simulation would assume this optimal cell placement.

Further considerations indicated that the segregation of the critical path would necessitate a factorial order of increase in the number of required training runs in order to attain more accurate and reliable simulations. Thus, even though an inclusion of a critical path is desirable, analysis has shown that the segregation of the critical path information is deemed undesirable. Better simulations almost invariably, furthermore, take more computer processing time, while the MP2D computer provides a data base of only some twelve runs.

Reference numeral 16 in the flowchart illustrates a "black box" to calculate a preliminary X-step and Y-step. With this, the five representatives, (a) the number of cells, (b) the number of basic wires, (c) the placement complexity, (d) the X-step (prelim.) and (e) the Y-step (prelim.) are then written on the learning base 18 and paired with the actual run time and statistics (as from 20)—also written on the data base. The preliminary X-step is shown at 22, the preliminary Y-step is shown at 24 and the generation of other statistical byproducts from the "black box" 16 is shown at 26. Thus, it will be evident that paired predictions are outputted whenever a match is inputted from unit 20 with the five representatives.

While it might be possible to write the components of the MP2D run on the data base 18 as the number of cells, for example, are so written, the algorithm of the invention does not envision that, and because it has been found to be advantageous not to incur the tremendous overhead that is associated with writing everything onto the learning base. Additionally, even if such added writing were decided upon, problems would result in attempting to decide just what is more or less important between such items as "the number of cells", "the metal-to-metal-channel-spacing", etc. when trying to make predictions. The alternatives therefore become: either attempting a multivariate correlation over an impossibly large number of runs, guessing haphazardly and unjustifiably because of the complex unforeseeable interactions, or choosing the simplist weighting-uniform weighting.

With the determinations previously decided upon, the next step is to employ a uniform weighting for the five representatives, keeping the X-step (prelim.) and Y-step (prelim.) so as not to leave deterministic quantities to the learning base. Thus, with the algorithm, the effects of the metal-to-metal-channel-spacing, the number of rows, the number of bonding pads, the standard cell height, the bonding pad height and width, and a few of the lesser known characteristics are already predetermined, *a priori.*

The constant K in the complexity expression 0(KN) is minimized by writing only those five representatives (non-deterministically interacting variables) on the learning base 18. Thus, in some sense, a fastest algorithm is achieved which is based upon all the known, inclusive interactions. The largest learning base possible is allowed—in this case 961 prime MP2D runs.

Considering the learning base 18, in more detail, it will first of all be appreciated that if the learning base is empty, the program will indicate this fact. When the learning base is not empty, the base is accessed and compared against, or with, the afore-mentioned five representatives. In carrying this out, no single best match is selected (unless, of course, the magnitude of the learning base is one), but rather form a non-constant weighting—where the weighting algorithm, or function, becomes a function of the magnitude of the learning base. In the learning base 18, furthermore, a ratio is formed in subroutine as "FRACT" of ABS (Est. REP−Act. REP)/Act. REP, where Est.=estimated, Act.=actual, REP=each of the five representatives taken individually. In this respect, it will be noted that a "perfect match" implies a ratio equal to zero and, of course, no upper bound is present. Then, using the previously described "uniform weighting", the sum over all five representatives is formed, noting that a "perfect match" still retains a sum of zero. The process is then iterated for the magnitude of the learning base, and the results stored in a dummy vector.

In accordance with the algorithm of the invention, the entries of such dummy vector are raised to the −1 power (with the discontinuity at 0 being simply replaced by symbolic infinity by virtue of right hand limits and D'Lhopitals Rule for functions of this type). The constant 1 in the power, −1, is justified by induction on the number of elements in the learning base and by the fact that results are to be mathematically (i.e. vectorially) normalized.

In sequence, one item, or run, is established in the learning base for N=1. Next, that fraction is normalized, by being divided by itself. The "square-wave" weighting, to be described below, could, in theory, be implemented at this stage in the sequence (i.e., replacing the −1 by the functionally dependent higher power such as −2, −3, −4 . . . ) to save some small extent in the number of required steps. However, such "square-wave" weighting has been decided not to be employed, because a floating point representation for some small, non-zero fractions could result in either a loss of accuracy in the predictions, or else the maximum size of the learning base would necessarily be somewhat more constrained and limited.

Thus, in accordance with the algorithm of the invention, all fractions in the dummy vector are to be replaced by a constant greater than, or equal to, one. Therefore, the sum of these constants will be seen to equal or exceed the magnitude of the dummy vector (a fact which is used by sub-routine normal). Such dummy vector, once normalized, then gives preliminary weighting, some of which can go to zero in certain cases, and because of underflow; however, this does not affect any results obtained since the maximum magnitude of the dummy vector can only go to 961. For such reason, the fractions stored in the dummy vector are to be defined on the half-open interval [0,1] where the magnitude of the vector exceeds one, and by [1] where the magnitude equals one. With such restrictions, it is possible to become more selective in choosing the cases to be given a high weighting as the learning base grows in size—i.e. as one proceeds towards a square wave configuration in the limit.

As will be appreciated by those skilled in the art, an important fundamental of intelligence is codified in the choice of the exponent—namely, that of concept formation. (In addition, cognitive modelling has shown that decision making under the best of circumstances performs in accordance with the linear algorithm, although with less memory and with less speed.) Square waves then best depict concepts because the smallest change in a variable can drastically alter the outcome—just as a 0, rather than a 0. can drastically alter the outcome of a FORTRAN program. Such concept, in accordance with this description, of course, is what caused the change—permitting the linear algorithm to become more sensitive to details as its learning base grows.

In determining the variable "power exponent" to employ in the main program, one first considers number theory which proves that any member on the open interval (0,1) raised to any power exceeding 1 and substantially normalized, will be reduced in magnitude and yet still be a member on (0,1). Then, by recursive reasoning, the fact that every rational on (0,1) will arbitrarily close to an irrational; and, because integers are finitely representable, the arrangements leads to the result that the higher the power, the lower the result—with the limit tending to zero.

With this in mind, consider taking X and Y as arbitrary members on the interval (0,1) with Z taken to be their difference (i.e., Z=ABS (X−Y). Then, if X power were taken, via Delta Epsilon proof, the new difference between them (i.e. Z') would tend to the zero as the power tends to an infinite integer. Because integers are faster, it is not necessary to be concerned with real powers, even though the same arguments with different proofs apply to rational powers, as well. By continuity it can be shown that Z'>Z if the power=2, 3, 4**, . . . . However, while the range becomes compressed, the relative differences (as shown by a subsequent normalization) are expanded (and, because the power is a positive non-linear constant).

As a result, the higher the power, the better the approximation will be to a perfect square wave. What the specific power will be will be understood to account in part for the possible underflow and any round-off errors present with any finite state machine. Furthermore, such initial fractions may vary considerably in magnitude—such that all these factors play an upper bound on the power which is to be given to any finite-automation and some measure of the deviation present among the fractions.

Analysis, furthermore, has shown that to accomplish this objective, the function must be carried out monotonically, increasing over the integers 1, 2, 3, . . . , 961—and that the function be carried out continuously and so defined. Although no single function can be established to be the one best in all instances, a good heuristic function which satisfies all the above criteria (and, particularly, the underflow and roundoff errors) is the square root function impinging upon the magnitude of the learning base as its monadic argument. With this in mind, the design program response was noted to become more "squarewave-like" each time the basis of cases hit a perfect square. In this regard, it will be understood that the "basis of cases" is printed on the terminal, and is in actuality, the magnitude of the learning base. Normalization will be seen to imply that each case in the learning base repetoire thus becomes assigned a positive weight, such that the sum of these weights reaches exactly 1.0.

Also, within the learning base 18, is the further step of weighting the actuals which are there stored and paired. The sum of these weighted actuals will then be the best prediction—both in term of chip statistics and run time. It will also be evident to those skilled in the art, that "run time" is a function of three "non-deterministic" representatives (i.e. non-deterministic in terms of what their aggregate effect is). As previously noted, such representatives comprise the number of cells, the number of basic wires required, and the placement complexity. Their fractions are also uniformly weighted, as described above, and the accuracy of the run-time predictions becomes purely a function of the learning base (i.e., there becomes no "black box" for the run-time). As will be seen from the drawing, the output of the learning base 18 appears at 30 for the "predicted time", at 32 for the X-step and Y-step predictions, with the necessary changes for any re-run being shown at 34. When no changes are required for the re-run 34, such is illustrated in the flowchart at 36, where the predictions are accepted, while any required changes are returned back to the data base 10, as indicated by 38, where the predictions are not acceptable or are not finalized.

In carrying out the invention, it will be recognized that the predictions made are auto-improving—such that the more MP2D runs that are supplied (up until 961), the better are the predictions which will be obtained. In actuality, the program has been successfully simulated at the maximum of 961 stored runs, where it has been determined that the algorithm automatically keeps track of all identification numbers and does not query the user to supply MP2D run results if a chip having the same identification number has previously been stored in the learning base 18. The described linear algorithm will be appreciated to also lend itself as an on-line data storage facility, in which the statistics and "run-time" for any known chip can be recalled by simply inputting the associated MP2D data-input base.

The MP2D program for the design of LSI and VLSI chips or microcircuits is covered by, and disclosed in detail in, U.S. Pat. No. 4,580,228, issued Apr. 1, 1986 to R. Noto, and assigned to the United States of America. The disclosure of this related patent is hereby incorporated by reference. Furthermore, as previously indicated, and as will be apparent from the foregoing disclosure, the purpose of the linear algorithm of the present invention is to predict "run" time (i.e., chip design time) and the likely size of the chip designed.

As will be appreciated by those skilled in the art, the linear algorithm of the invention is also important as it serves as an example of how machine intelligence, and specific learning systems, can fill an existing void present with the available computer aided design tools now present. In such manner, the "black box" 16 and its "weighting functions" can be easily modified, with such modifications making the program that much more versatile. For example, predictions can be interpreted as heuristics, and used to guide the partitioning of placement in the MP2D unit itself. In such manner, the heuristics are then created to fit the problem, making the overall arrangement one which is dynamic in use. All that will be necessary will be seen to be the creation of the heuristics ultimately tied to the learning base in question.

In carrying out the teachings of the invention, it has been found that the use of a segmented data base is highly recommended—for example, with LEARN1, LEARN2, LEARN3 . . . , LEARN9 . . . as segments. In this respect, LEARN2 might contain all those MP2D runs for which the "run-time" was not logged, while LEARN3 might serve as a back-up file for data protection. Additionally, all fixed placement runs should be similarly segmented, with the "run-time" of the program being somewhat improved if the data was segregated unto clusters, each of which defining a distinct data file. In such event, the file should be opened manually—however, this would require that the user know *a priori*, which of the clusters would best bound a particular run. As will be evident, the trade-off becomes one of machine time for human time—but, with the accuracy of results not being affected either way, due to the normalization method described. Furthermore, it has been found that the desired results are most prevalent where only "fresh" data bases are used, as the algorithm aclimates to the particular machine and version of MP2D being utilized. In this context, the units employed must therefore be maintained consistent—i.e. entering mils for a mils data base, for instance, and entering microns for a micron data base. Because it becomes quite important to note that the credibility of the results is a function of both the size of the data base and, more importantly, its consistency with future runs, it may be desirable in future usage to rewrite the data base in response to any modifications and forthcoming versions of MP2D.

While there has been described what is considered to be a preferred embodiment of the linear algorithm of the invention, it will be appreciated by those skilled in the art that modifications can be made without departing from the scope of the teachings herein, and, particularly, the sizing of an exponent tied to the magnitude of the learning base so that the algorithm becomes more selective as the learning base grows. With such stipulation, it will be noted that the convergence rate to a perfect prediction every time would continue positive, but would be decelerating as the learning base expands, yet continuing to perform the cluster analysis in O(N) time. For at least such reason, resort should be had to the claims appended hereto for a true understanding of the invention.

I claim:

1. A computer process for the automatic layout of multiport, two-dimensional microcircuits comprising the steps of:

(a) defining a general microcircuit layout including an x-y orthogonal grid, logic cell geometry and relative cell placement, and node interconnections of logic cells;

(b) generating an initial placement surface of logic cell rows by establishing cell placements on said orthogonal grid;

(c) exchanging cell pair locations according to multiple criteria in order to optimize cell placement;

(d) exchanging node-connected cell pairs along cell rows to thereby reduce the distance to the nearest connected cells;

(e) establishing routing for pin-to-pin connections;

(f) establishing subchip interior routing;

(g) establishing routing from cell rows to peripheral power connectors;

(h) analyzing routing output for translation to a computer graphics language which is suitable for describing the fabrication layout of the circuit module;

(i) creating power bus routes;

(j) translating placement and connection data into said computer graphics language; and (k) predicting from the microcircuit layout parameters the microcircuit design or run time and the probable size of the microcircuit.

* * * * *